US006934798B2

(12) United States Patent
Regev et al.

(10) Patent No.: US 6,934,798 B2
(45) Date of Patent: Aug. 23, 2005

(54) CAM WITH POLICY BASED BANDWIDTH ALLOCATION

(75) Inventors: Alon Regev, Woodland Hills, CA (US); Zvi Regev, West Hills, CA (US)

(73) Assignee: Micron Technology, Inc., Boise, ID (US)

( * ) Notice: Subject to any disclaimer, the term of this patent is extended or adjusted under 35 U.S.C. 154(b) by 297 days.

(21) Appl. No.: 10/330,210

(22) Filed: Dec. 30, 2002

(65) Prior Publication Data

US 2004/0128437 A1 Jul. 1, 2004

(51) Int. Cl.[7] .............................................. G06F 12/00
(52) U.S. Cl. ........................ 711/108; 711/128; 365/49
(58) Field of Search ................................ 711/108, 128; 365/49

(56) References Cited

U.S. PATENT DOCUMENTS 5,555,397 A * 9/1996 Sasama et al. .............. 711/158
6,647,457 B1 * 11/2003 Sywyk et al. ............... 711/108
6,711,041 B2 * 3/2004 Pereira et al. ................ 365/49

* cited by examiner

*Primary Examiner*—Nasser Moazzami
(74) *Attorney, Agent, or Firm*—Dickstein Shapiro Morin & Oshinsky LLP

(57) ABSTRACT

A content addressable memory (CAM) simultaneously searches packet categories in the CAM, and automatically allocates network resources, such as bandwidth, between the categories. Categories and their allocation are based on various data characteristics, such as video, voice, graphic, or text. Bandwidth allocations determined by the user give priority to video data over graphics, for example. Graphics data, in turn, is given more bandwidth than voice or text data. A dynamic average of the bandwidth usage of each priority category is maintained. Enablement of priority categories is determined, at least in part, based on whether or not the average usage is above or below an allocated level.

41 Claims, 13 Drawing Sheets

CAM WITH POLICY BASED BANDWIDTH ALLOCATION

BACKGROUND OF THE INVENTION

1. Field of the Invention

The present invention relates to content addressable memories, and more specifically, to content addressable memories having bandwidth allocation for use in high speed data communication networks.

2. Brief Description of the Related Art

Modern communications systems transmit data over digital networks. System resources are finite, so allocation of those resources becomes necessary. For example, system capacity limitations may restrict the amount of data that can be transmitted by the network, or a user may wish to give priority to certain categories of data over others.

Practically all digital networks make use of some form of packet or block type data format to dynamically route data packets or blocks through the network. The data contained in the packets can be categorized in various ways, including type of packet, packet content, size, creation date, and urgency of delivery, for example. Depending on the purpose of the communications system and the preferences of the user, it may be necessary to limit or expand the amount of bandwidth to be allocated to a particular category of data.

Content addressable memories (CAMs) are used in communications systems as search engines for routing paths in data network routers and switches. The packets being routed can be viewed as belonging to a particular category. Typically, a CAM issues a single search result that is independent of a packet category. Consequently, it is necessary for the user to handle bandwidth allocation, for example, by discarding search results for certain categories. A significantly more efficient way of utilizing a CAM as a search engine is needed.

BRIEF SUMMARY OF THE INVENTION

The present invention provides a CAM modified to simultaneously search packet categories in the CAM, and automatically allocate network resources, such as the bandwidth, among the categories. Categories and their allocation can be based on various data characteristics. For example, packets can be categorized as containing various types of data, such as video, voice, graphic, or text. Bandwidth allocations are determined by the user so certain categories of data are given priority over other categories of data. For example, video data can be given priority over graphics data, which, in turn, can be given priority over voice or text data. According to a preferred embodiment, a dynamic average of the bandwidth usage of each priority category is maintained. Enablement of priority categories is determined based on whether or not the average usage is above or below an allocated level. Other features and advantages of the present invention will become apparent from the following description of the invention which refers to the accompanying drawings.

DETAILED DESCRIPTION OF THE INVENTION

Figure 1:
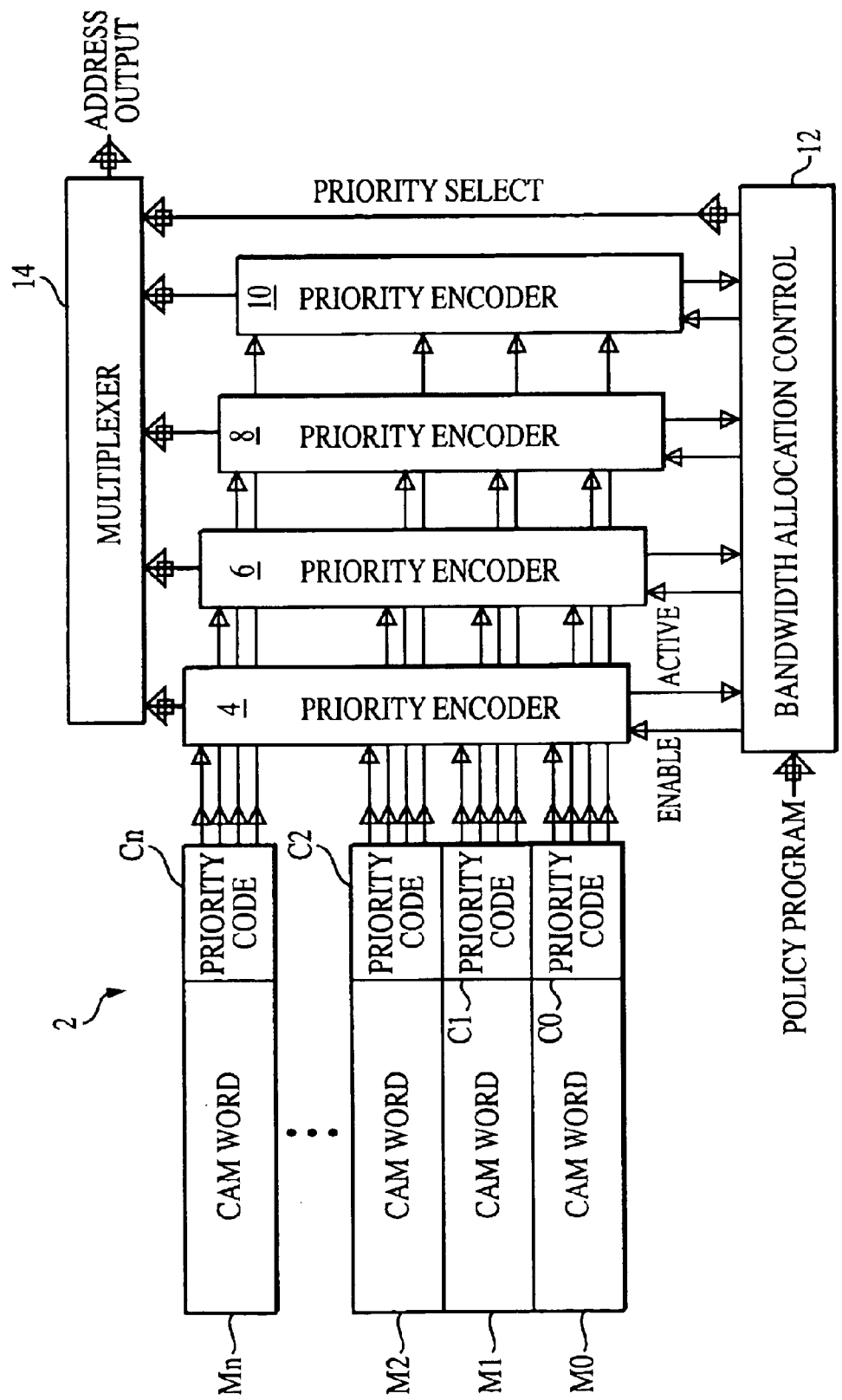
FIG. 1 is a block diagram of an exemplary embodiment of a CAM according to the present invention.

Referring to FIG. 1, a block diagram illustrates a modified CAM 2 according to an exemplary embodiment of the present invention. CAM 2 includes a plurality of CAM storage locations which store CAM words (e.g., M0) and which also have associated respective storage locations (e.g., C0) for storing a priority coded with each CAM word. When a searched-for word is simultaneously presented to each of the CAM storage locations, those that match indicate the match to a plurality of priority encoders 4, 6, 8, 10, each of which, when presented with multiple matches of a CAM word, encode the highest priority match from which an address of a word can be deduced. In the present embodiment, four priority encoders 4, 6, 8, 10 are shown, although the invention is not so limited.

Each priority encoder 4, 6, 8, 10 is assigned a particular category of packets. Priority encoder 4, for example, is assigned a video category, while voice data is assigned to priority encoder 6. Similarly, priority encoder 8 is assigned graphics-based data, while text-based data is assigned to priority encoder 10.

Each priority encoder receives the match inputs from CAM words M0–Mn having data in the same category as the priority encoder. The priority code section C0–Cn added to each respective CAM word M0–Mn, defines which of the priority encoders 4, 6, 8, 10 is to be used in case of a match between the data stored in that CAM word, and the data in a comparand register (not shown). Thus, if a match is found at CAM word M0, and the priority code C0 indicates that the data is in a video category, priority encoder 4 is used to encode the match. If, on the other hand, the priority code C0 indicates that the data is in a voice-based category, priority encoder 8 is used to encode the match. Matches in each of the remaining CAM words M1–Mn similarly have a respective priority code C1–Cn for selecting a priority encoder used for priority encoding multiple matches of data words.

A CAM word M0–Mn may be associated with more than one priority encoder 4, 6, 8, 10 at any given time. For example, a match found at CAM words M2 may be indicated by priority code C2 to be categorized as both video data and text-based data. Consequently, priority encoders 4 and 10 are used to priority encode the word match.

A bandwidth allocation control circuit 12 receives information from each of the priority encoders indicating that a priority encoder is seeing at least one match at its match inputs, and provides the priority encoders with an enabling signal which allows the priority encoders 4, 6, 8, 10 to perform their encoding functions. Bandwidth usage in each category is monitored, as described further below. Based on the calculated bandwidth usage and pre-programmed policies, bandwidth allocation control circuit 12 determines which category, or categories, of encoding, that is, which of priority encoders 4, 6, 8, 10 may be enabled to encode the match signals on their inputs.

Once an encoder's category is enabled, a highest priority match is encoded by the enabled priority encoder and provided to multiplexer 14. Multiplexer 14, also controlled by bandwidth allocation control circuit 12, decodes and outputs address information for highest priority stored words which match the search word.

Figure 2:
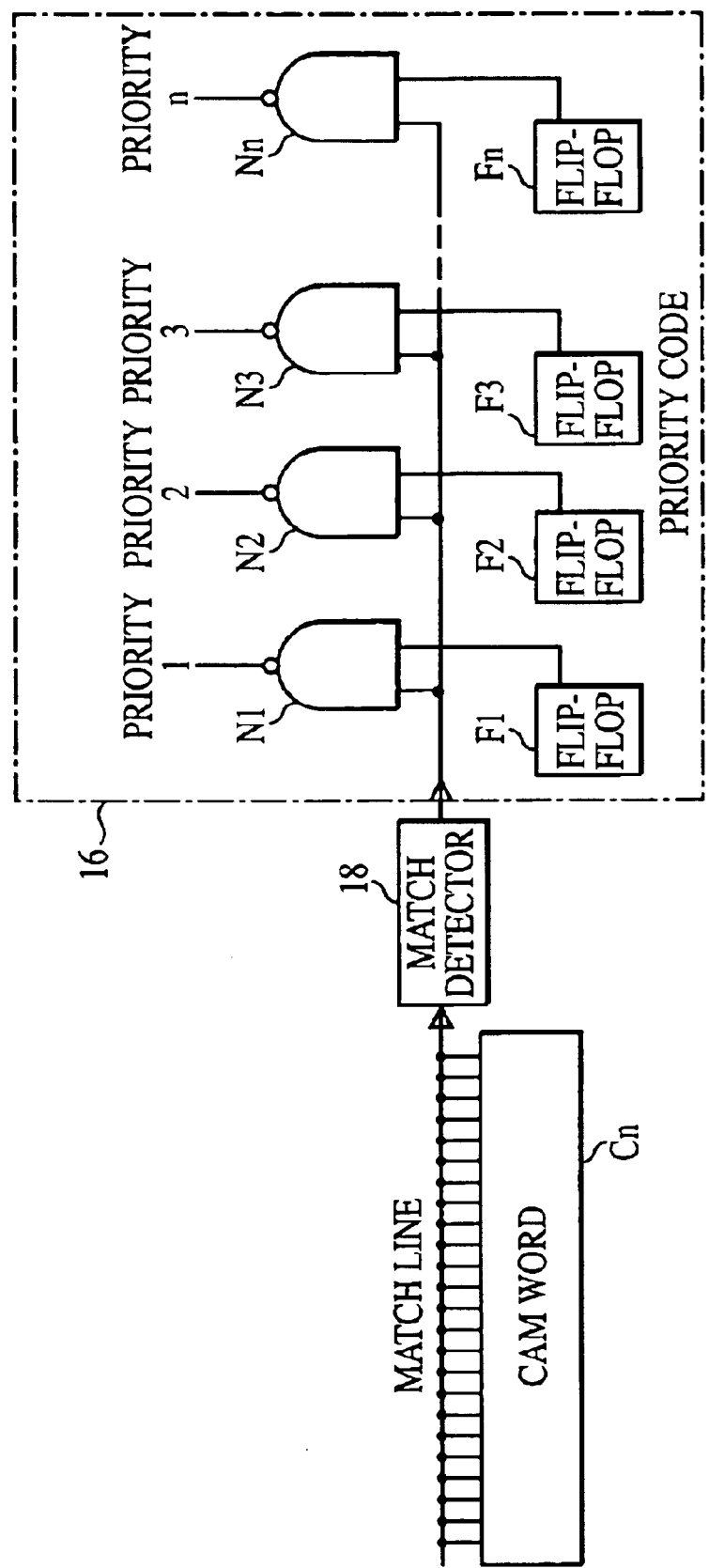
FIG. 2 illustrates a priority code circuit according to an exemplary embodiment of the present invention.

Referring to FIG. 2, an embodiment is illustrated of an exemplary priority code circuit 16, which can be used as priority code circuits C0–Cn in FIG. 1. Priority code circuit 16 receives active signals on a match line by way of a match detector 18, indicating that associated word data in a CAM corresponds to comparand data. Active matches detected by match detector 18 are provided to NAND gates N1–Nn, along with stored priority code flip-flop values F1–Fn. A bit pattern priority code at the outputs PRIORITY1–PRIORITYn is indicated by a logic low at each output if the detected match has a priority code equal to the corresponding flip-flop stored priority value. This stored bit pattern priority code points to a specific one or more of priority encoders 4, 6, 8, 10 for priority encoding the matching words as a result of a CAM memory search. For example, a matching CAM word contains a priority code that matches the value stored in flip-flop F1, priority encoder 4 will be used for priority encoding the matching CAM word. Similarly, if a matching CAM word contains a priority code matching the values in flip-flops F2 and F3, priority encoders 6 and 8, respectively, will be used to priority encode the matching CAM word.

Figure 3:
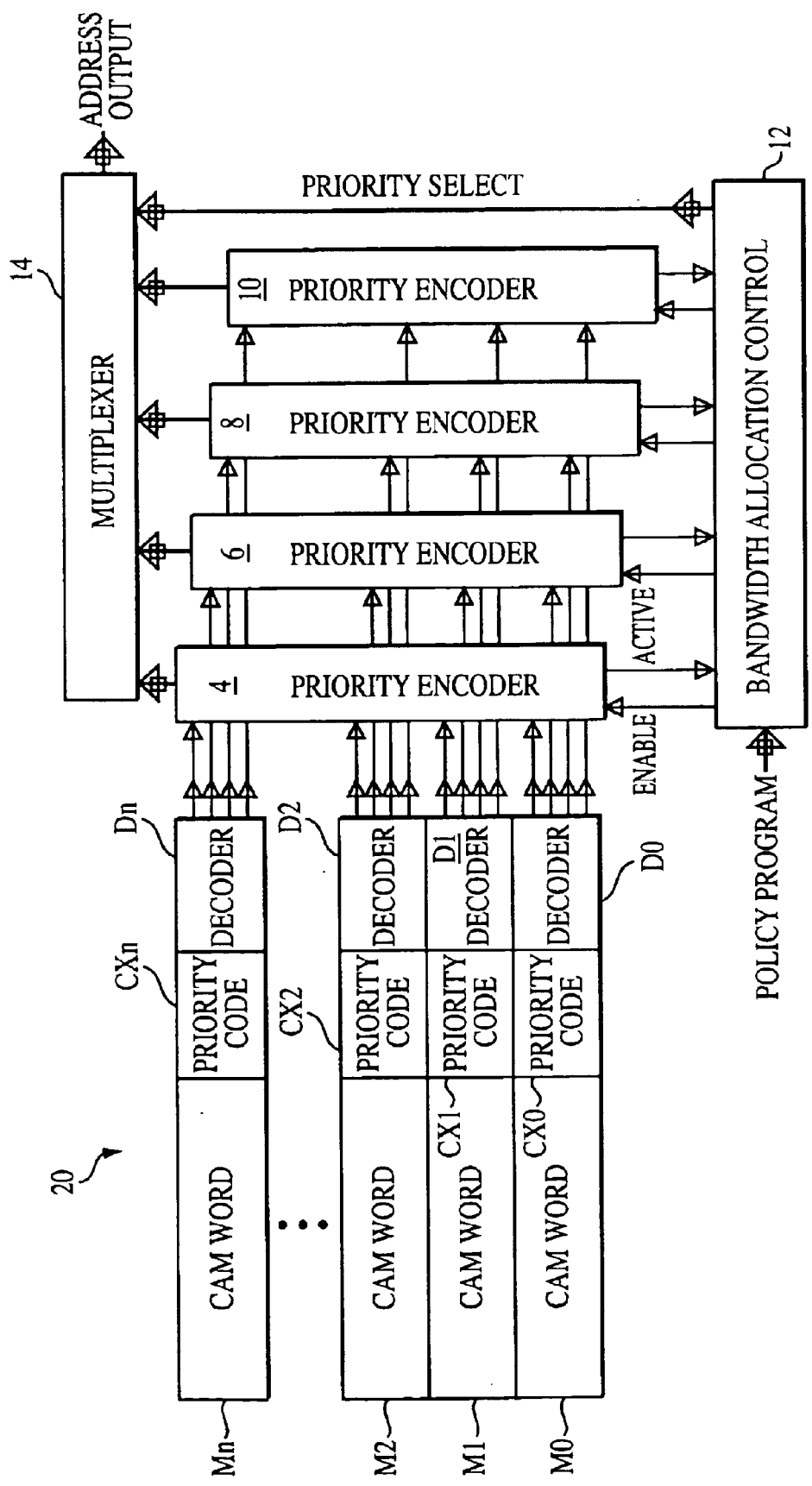
FIG. 3 is a block diagram of a CAM according to an alternative embodiment of the present invention.

Referring to FIG. 3, an alternative embodiment of the present invention is illustrated. CAM 20 of FIG. 3 is similar to the exemplary embodiment of FIG. 1, except that priority code data pointing to a specific priority encoder is stored as an encoded binary number. For n bit binary presentation, there are $2^n$ unique combinations. Using a "one-hot" decoder, the representation, for example, in priority code stored in the code circuits CX0–CXn is decoded by the decoder to one out of $2^n$ active outputs of the priority assigned. Accordingly, decoders D0–Dn following priority code circuits CX0–CXn are used such that only a single priority encoder 4, 6, 8, 10 may be selected at any given time. Otherwise, FIG. 3 operates in the same manner as described above for FIG. 1.

Figure 4:
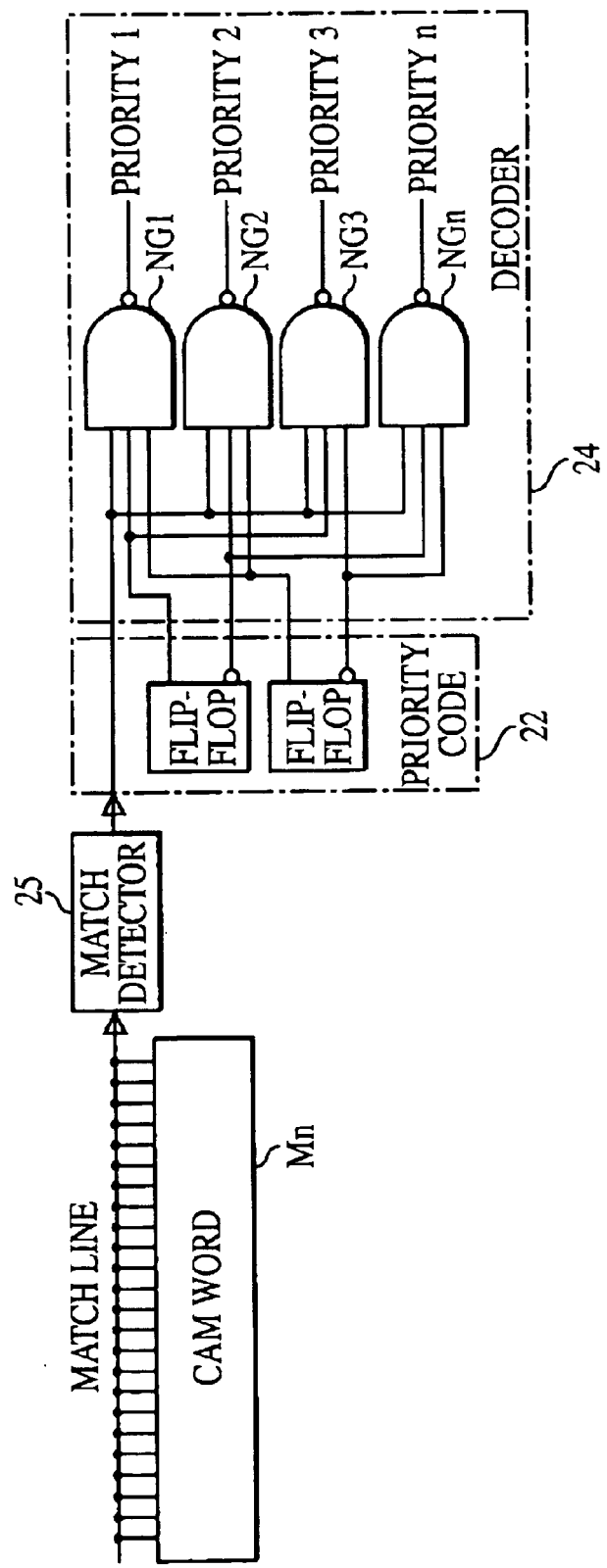
FIG. 4 illustrates a priority code circuit according to an alternative embodiment of the present invention.

FIG. 4 illustrates an embodiment of an exemplary priority code circuit 22, used as priority code circuits CX0–CXn, and a decoder 24 used as a decoder D0–Dn, in FIG. 3. Priority code circuit 22 receives active signals on a match line by way of a match detector 25, indicating that word data in a CAM corresponds to comparand data. Active matches detected by match detector 25 are provided to NAND gates NG1–NGn of decoder 24, along with stored one-hot encoded flip-flop values of priority code circuit 22. A priority code PRIORITY1–PRIORITYn is indicated by a logic low if the detected match has a priority code equal to the corresponding stored priority value, causing a CAM word match to be priority encoded by the corresponding priority encoder based on its priority coded category, similar to the priority encoder selection operation described above in connection with FIG. 2.

Figure 5:
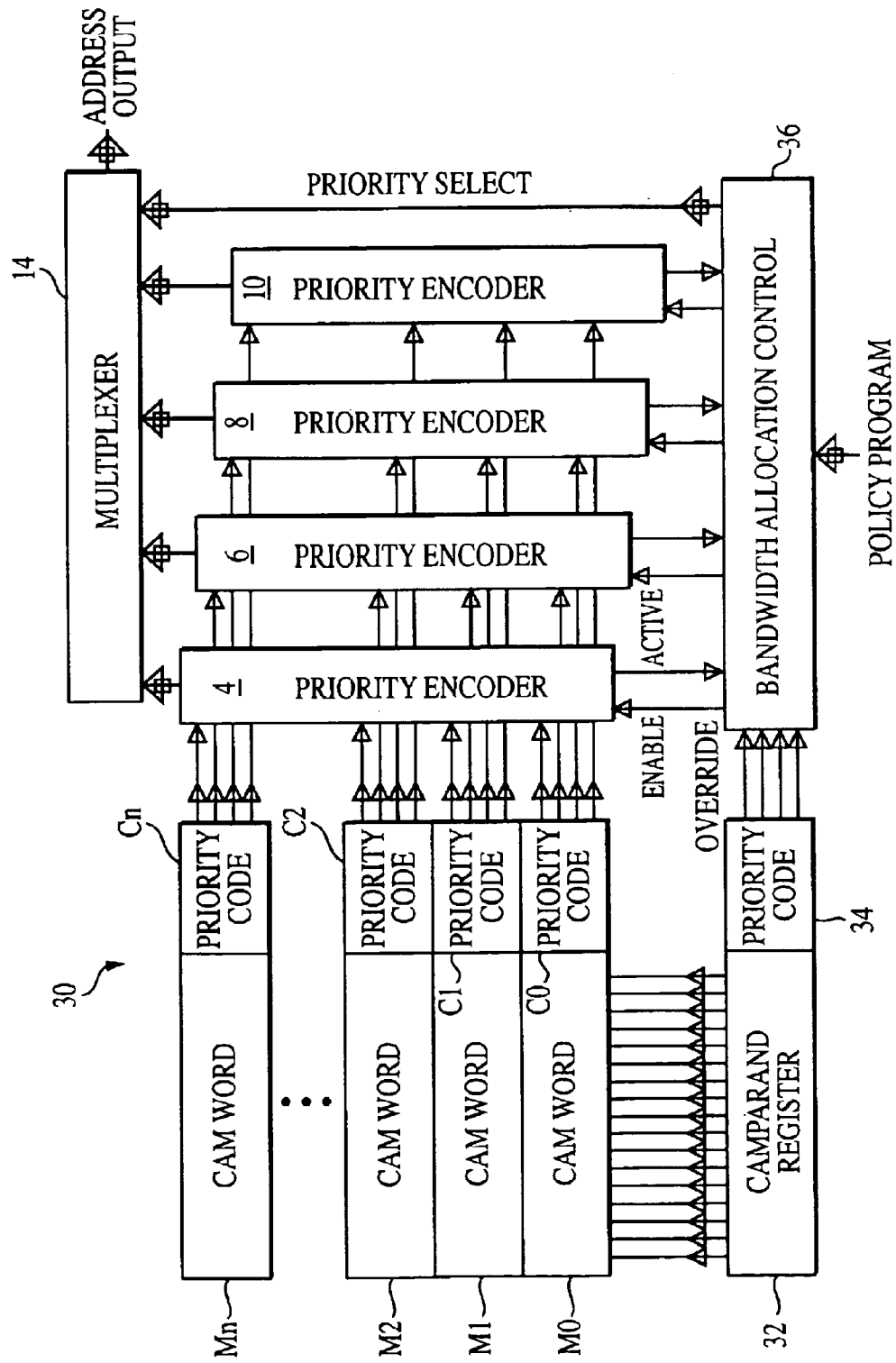
FIG. 5 is a block diagram of a CAM according to a second alternative embodiment of the present invention.

FIG. 5 illustrates a second alternative embodiment of the present invention. CAM 30 is similar to CAM 2 illustrated in FIG. 1, except that a user can override the bandwidth allocation control set by control circuit 36, and force, using priority assignment data in the comparand register, which priority encoder will be enabled, at any given time, regardless of the bandwidth allowed by the control circuit 36. Thus, CAM 30 includes comparand register 32, and comparand priority code 34. Comparand priority code 34 is used to override an enable determination by bandwidth allocation control circuit 36, such that the category indicated by the priority code attached to the comparand data is given priority over the category that may have been determined to have priority by the bandwidth allocation control circuit 36.

Figure 6:
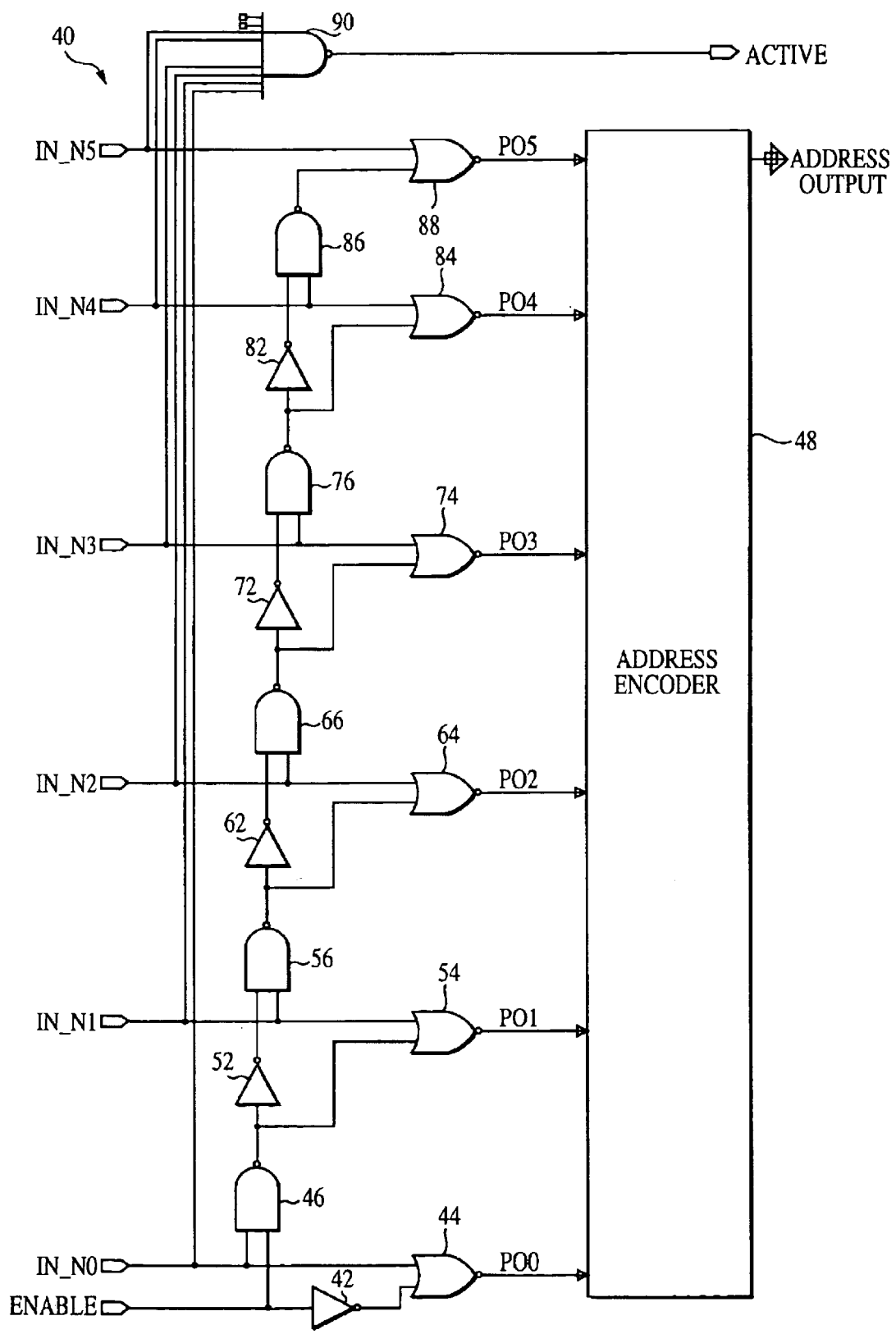
FIG. 6 illustrates a priority encoder circuit according to an exemplary embodiment of the present invention.

FIG. 6 illustrates a typical priority encoder 40, such as could be used as priority encoder 4, 6, 8, or 10, for example, in each of the CAMs 2, 20, and 30. Priority encoder 40 shown in FIG. 4, utilizes a "thermometer" type of arrangement of logic gates to determine which of the inputs has the highest priority. Priority encoder 40 is arranged as a series of stages arranged from bottom to top, each stage having progressively lower priority.

In the exemplary embodiment of FIG. 6, a priority encoder stage includes a NOT gate, a NAND gate, and a NOR gate. A highest priority stage includes NOT gate 42, which inverts an ENABLE signal and supplies it to NOR gate 44. NOR gate 44 also receives a signal on match line input IN_N0. ENABLE also is supplied to NAND gate 46, along with match line input N0. The result from NOR gate 44 is supplied on output terminal PO0 to an address encoder 48. Address encoder 48 provides an address output corresponding to the highest priority match line detected by the priority encoder to a multiplexer, such as multiplexer 14 shown in FIGS. 1, 3, and 5, for example.

Priority encoder 40 includes several such stages, of which six are shown in FIG. 6. Thus, the result from NAND gate 46 is supplied to the next logically lowest priority stage (physically higher on the "thermometer") made up similarly of NOT gate 52, NOR gate 54, and NAND gate 56. NOR gate 54 supplies a signal to output terminal PO1, and NAND gate 56 supplies its signal to the third lowest priority stage made up of NOT gate 62, NOR gate 64, and NAND gate 66, the stage delivering an output signal on PO2. Similar fourth- and fifth-lowest priority stages are shown which include NOT gates 72 and 82, NOR gates 74 and 84, and NAND gates 76 and 86, respectively, the stages providing output signals on PO3 and PO4 to address encoder 48. A final sixth stage includes NOR gate 88, providing its output signal on PO5.

In operation, matches are indicated on match lines IN_N0–IN_N6 as logic 0, the ENABLE signal having a logic high. Thus, in the first stage, if match line IN_N0 is low, output PO0 will be high, indicating a highest priority match.

Priority encoder 40 includes an ACTIVE output, which goes to a logic LOW every time any input to the priority encoder is active. The ACTIVE signal is provided by multiple-input NAND gate 90, to the bandwidth control circuit (12 in FIGS. 1 and 3; 36 in FIG. 5), NAND gate 90 receives input signals from each of the signal lines IN_N0–IN_N5.

Figure 7:
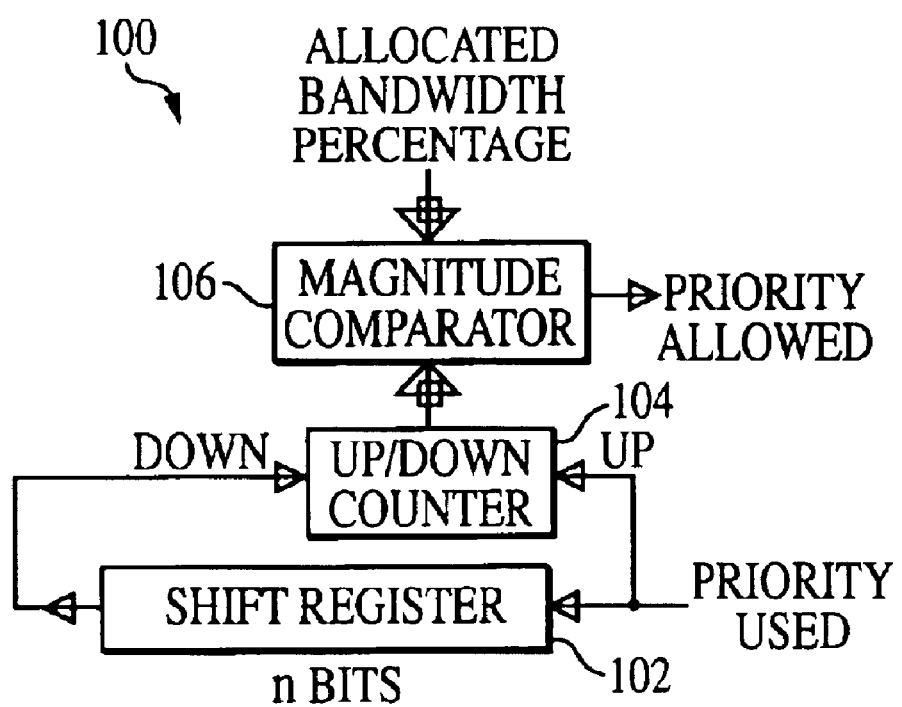
FIG. 7 is a block diagram of a bandwidth percentage averager according to an exemplary embodiment of the present invention.

For each priority category, the CAM is equipped with a usage averager 100, an exemplary embodiment of which is illustrated in FIG. 7. Usage in each priority code category is calculated over a range of n routed packets. Averager 100 includes an n-bit shift register 102, which is shifted each time activity occurs in any priority category as indicated by the ORing of all PRIORITY USED signals. More specifically, if a routed packet is in the priority to which the averager is assigned, a logic "1" is written into the shift register. If the routed packet is in a different priority, a logic "0" is written to the shift register.

The PRIORITY USED signal also is provided to the UP input of an up/down counter 104, having $\log_2 n$ bits. Each time a "1" is written to shift register 102, up/down counter 104 increments one count. The output of shift register 102 is supplied to a DOWN input of up/down counter 104, such that every a "1" appears at the output of the register, the counter decrements one count. Consequently, up/down counter 104 holds a dynamic average in the priority code category to which the counter is assigned, with respect to the last n routed packets.

A magnitude comparator 106 connected to up/down counter 104 determines whether the number of packets routed in the assigned priority code category is below or above the percentage bandwidth allocated to that priority code.

Figure 8:
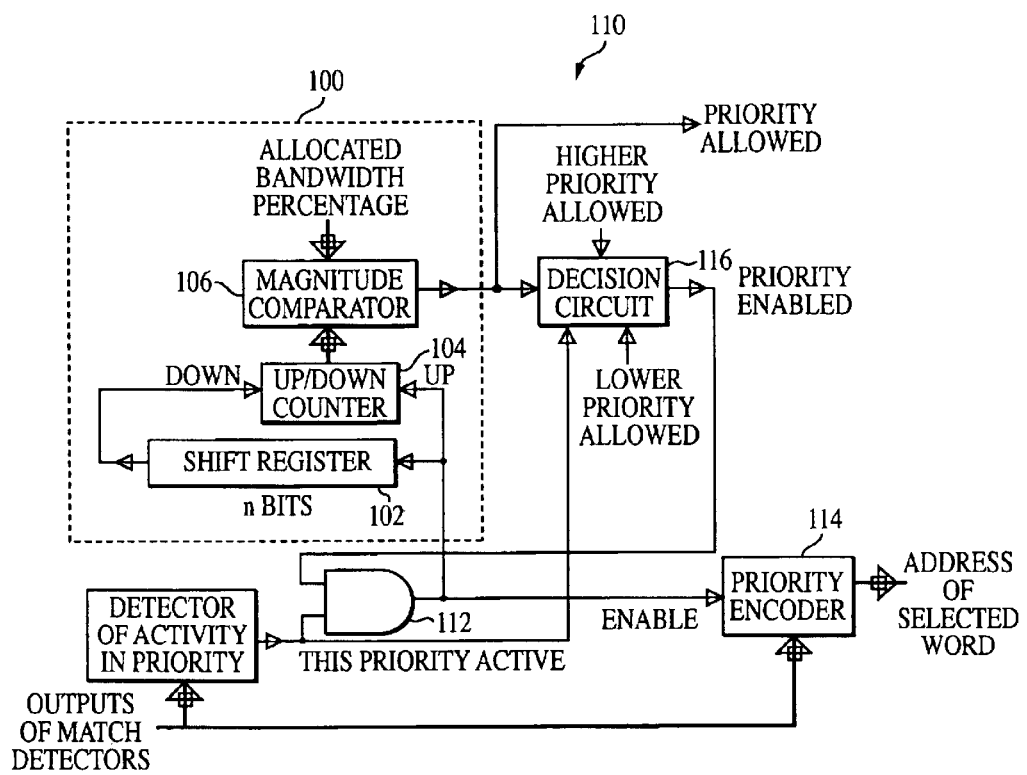
FIG. 8 is a block diagram of an exemplary embodiment of a priority bandwidth allocation circuit according to the present invention.

Referring to FIG. 8, an exemplary embodiment of a bandwidth allocation control circuit 110 is illustrated, such as would be provided in bandwidth allocation control circuit 12 of FIGS. 1 and 3, and bandwidth allocation control circuit 36 of FIG. 5. Bandwidth allocation circuit 110 includes the averager 100 of FIG. 7. Averager 100 receives enabled match detection signals by way of AND gate 112, which also provides signals to one of the priority encoders 4, 6, 8, 10 described above.

The PRIORITY ALLOWED output of averager 100 is supplied to a decision circuit 116. In addition, decision circuit 116 receives a indication that the priority is active, along with HIGHER and LOWER PRIORITY ALLOWED signals, the purpose of which is explained below in connection with the decision circuit flow chart.

Figure 9:
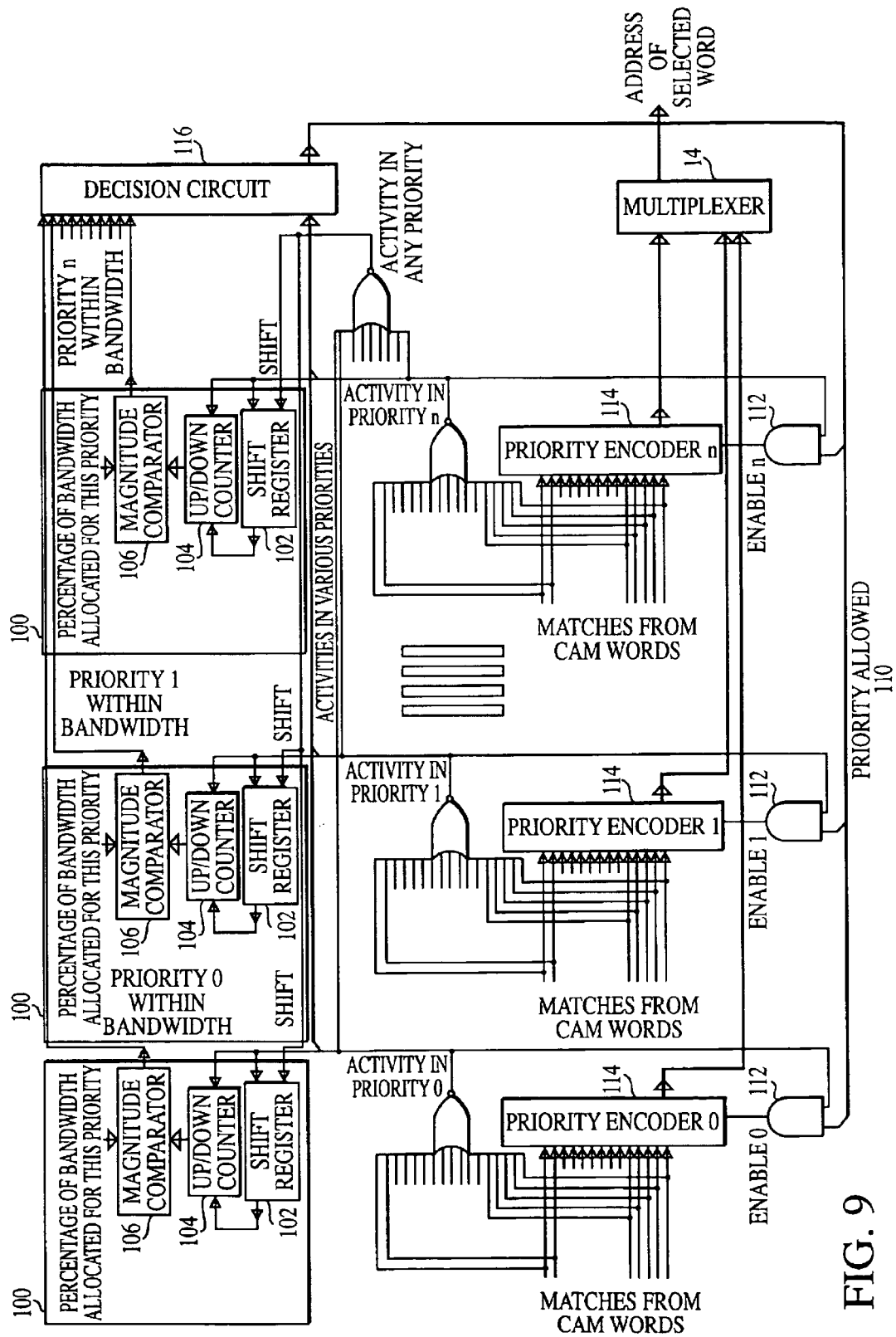

FIG. 9 illustrates an exemplary implementation of the averager in a priority encoder according to the present invention. As shown in FIG. 9, a plurality of priority encoders PRIORITY ENCODER 0 . . . PRIORITY ENCODER n each are implemented as priority encoder 114 of FIG. 8. Matches from CAM words are supplied to a priority encoder 114 in each priority category, and CAM word match activity in each priority category also is supplied to a plurality of averagers 100 associated respectively with each PRIORITY ENCODER 0 . . . n. The usage results from the averagers 100 are supplied to decision circuit 116 for use in bandwidth allocation control determinations.

Figure 10:
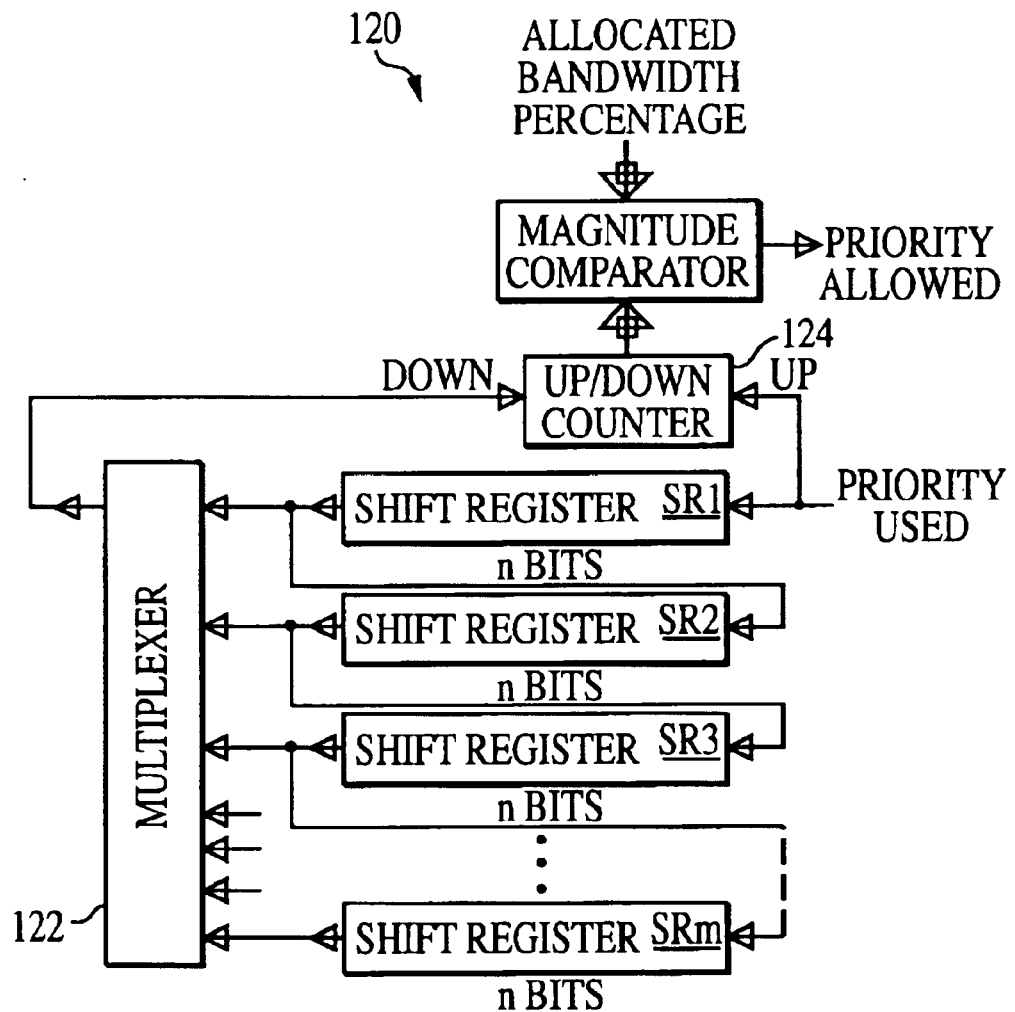
FIG. 10 is a block diagram of an averager having a variable range of averaging according to the present invention.

An averager 120 having a variable range of averaging according to an alternative embodiment of the present invention is illustrated in FIG. 10. Averager 120 uses a plurality of n-bit shift registers SR1–SRm coupled to a multiplexer 122. Shift registers SR1–SRm are arranged in a cascade, such that the output of shift register SR1 is supplied to shift register SR2 as well as multiplexer 122. Similarly, an output signal from shift register SR2 is provided to shift register SR3 and multiplexer 122. The remaining shift registers SR3–SRm-1 are arranged similarly, with the last shift register SRm supplying its output only to multiplexer 122.

The output from multiplexer 122 is coupled to the DOWN input of up/down counter 124, which operates in a manner similar to that of up/down counter 104 discussed above in connection with averager 100. Thus, up/down counter 124 also receives a PRIORITY USED input, and holds a dynamic average with respect to the last (SR×n) routed packets in the priority code category to which the counter is assigned.

The range of routed packets (SR×n) over which the dynamic average is taken is determined under control of multiplexer 122. Depending on the range desired, multiplexer 122 will accept outputs from 1, 2, 3, up to m n-bit shift registers. Thus, the range over which the dynamic average is taken can be adjusted in increments of n bits.

The output of up/down counter 124 is supplied to magnitude comparator 126. Thus, averager 120 can replace averager 100 in bandwidth allocation circuit 110 shown in FIG. 8.

Figure 11:
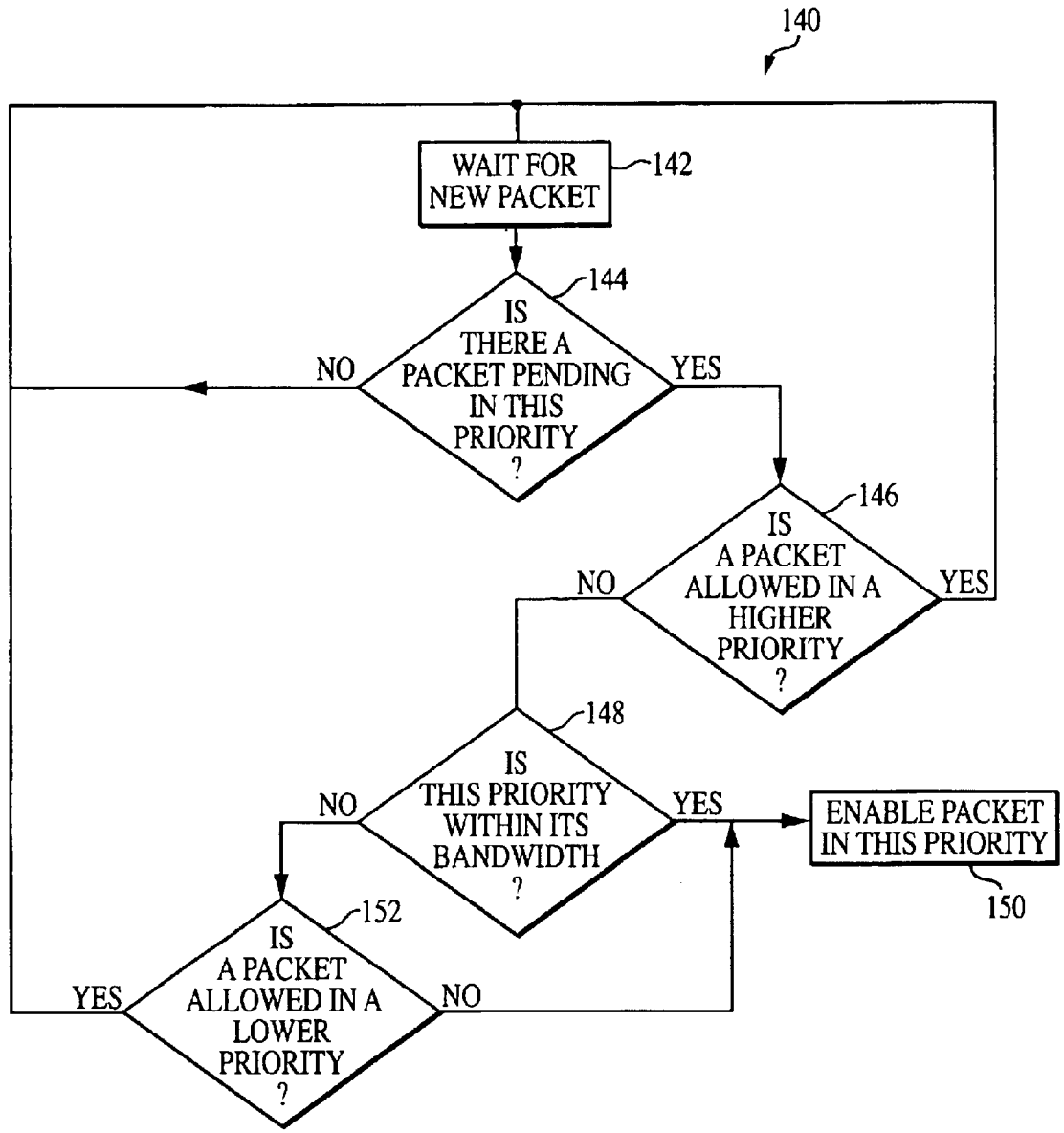
FIG. 11 is a flow chart of a decisions circuit according to an exemplary embodiment of the present invention.

FIG. 11 illustrates a decision circuit flow chart 140 according to an exemplary embodiment of the present invention. The bandwidth allocation control circuit for an assigned priority code category waits for a new packet at step 142. When a new packet is pending at step 144 in the category, a determination is made as to whether another packet is being allowed in a higher priority at step 146. If a higher priority packet is being allowed to be priority encoded by the associated priority encoder, the new packet is not, and the control circuit returns to waiting for new packets at step 142.

If no higher priority packet is being allowed for priority encoding, a determination is made as to whether the new packet is within its allocated bandwidth at step 148. If so, priority encoding of the packet is allowed at step 150. If not, a determination is made as to whether encoding for a packet is being allowed in a lower priority at step 152. If not, priority encoding of the new packet is allowed at step 150. If so, the control circuit returns to waiting for new packets at step 142.

Figure 12:
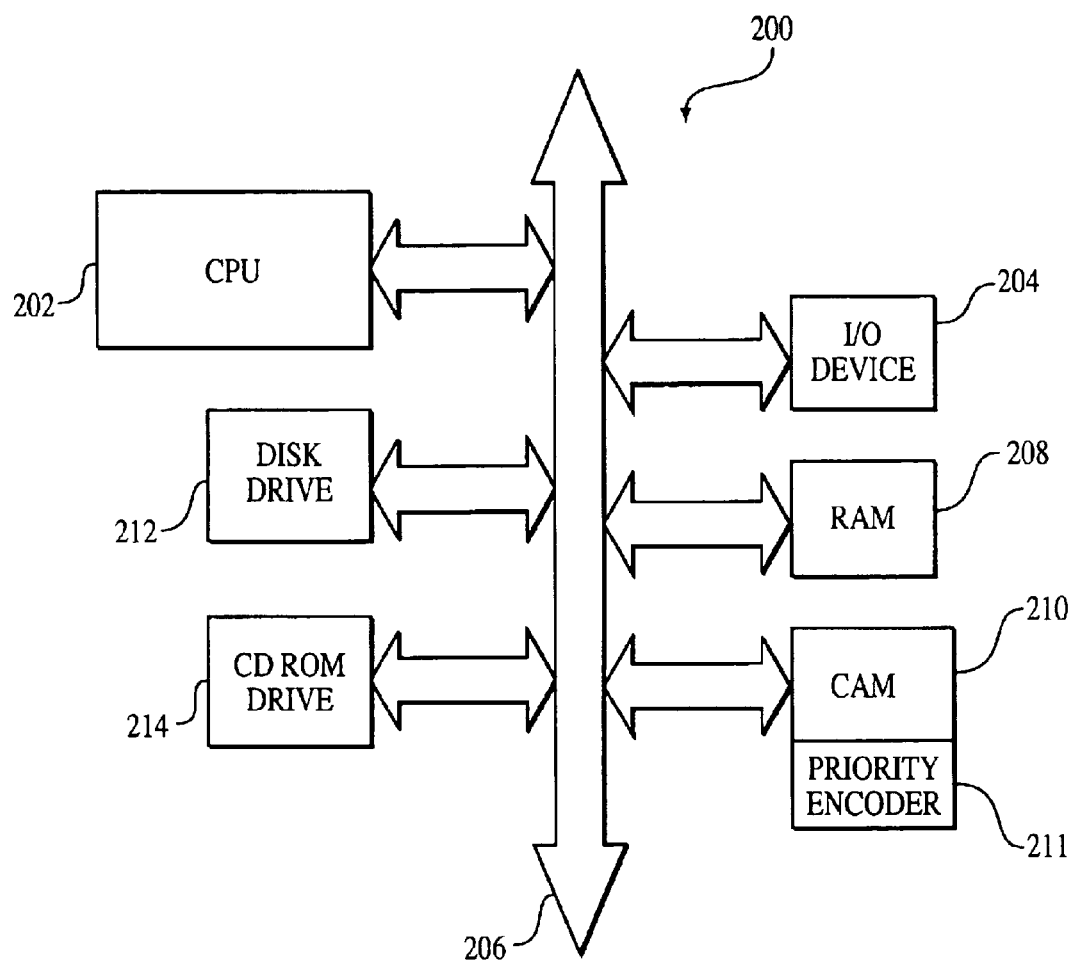
FIG. 12 is a block diagram of a microprocessor-based system including a CAM according to the present invention.

Referring to FIG. 12, a processor system 200 is represented which used a CAM 210 employing a priority encoder 211 according to the present invention. Processor system 200 generally comprises a central processing unit (CPU) 202, such as a microprocessor, that communicates with one or more input/output (I/O) devices 204 over a bus 206. The processor system 200 also includes random access memory (RAM) 208. One or more CAM devices 210 also communicate with CPU 202, CAM 210 utilizing a priority encoder 211 according to the present invention. In the case of a computer implementation for accessing a database, for example, the system may include peripheral devices such as a floppy disk drive 212 and a compact disk (CD) ROM drive 214 which also communicate with CPU 202 over the bus 206.

Figure 13:
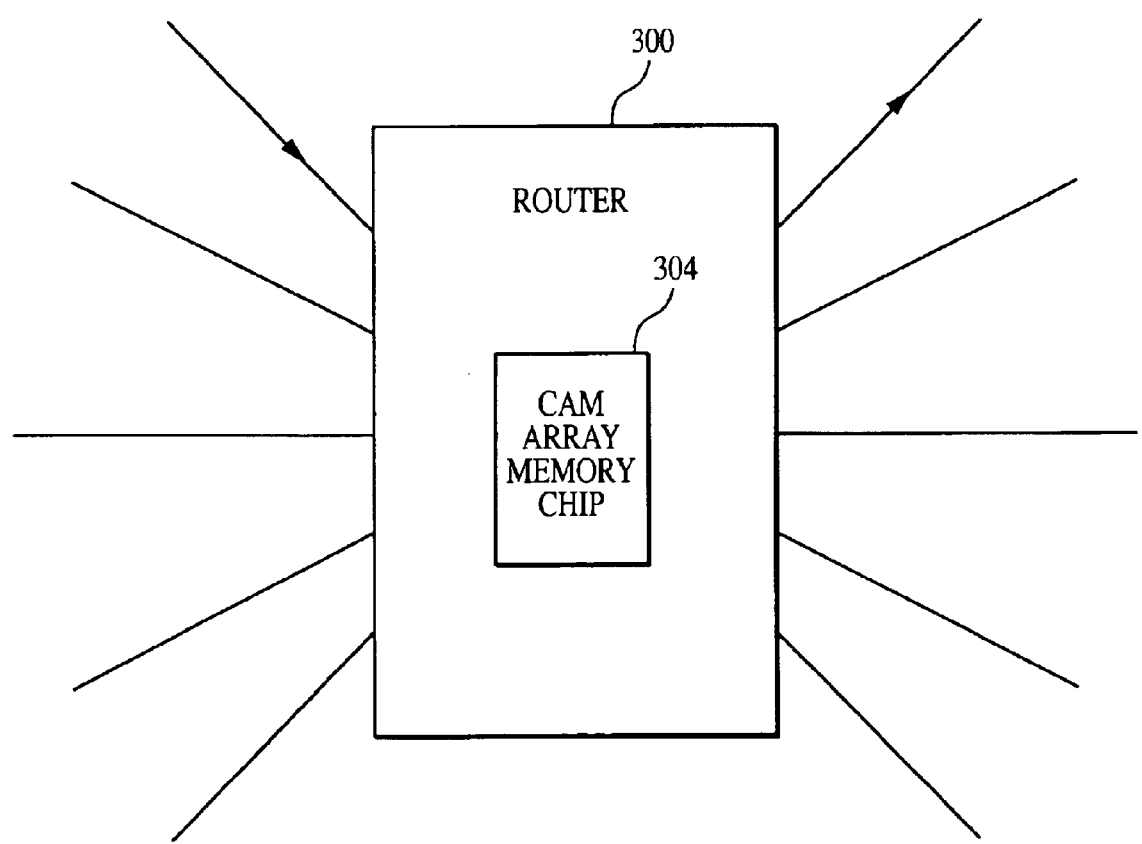
FIG. 13 illustrates a router which includes a CAM and a priority encoder according to an exemplary embodiment of the present invention.

FIG. 13 illustrates a router 300 including a CAM containing a priority encoder according to an exemplary embodiment of the present invention. Router 300 is connected to a CAM array memory chip 304 as may be used in a communications network, such as, e.g., part of the Internet backbone, or a local area network. Router 300 includes a plurality of input lines and a plurality of output lines. Data transmitted from one location to another is sent in packet form. Prior to the packet reaching its final destination, packet are received devices, such as router 300, for decoding data identifying the packet's ultimate destination, and deciding which output line and what forwarding instructions are required for the packet.

The present invention provides an apparatus and method for allocating encoding multiple simultaneous matches in a CAM. While preferred embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed as new and desired to be protected by Letters Patent of the United States is:

1. A content addressable memory (CAM) comprising:
    a plurality of CAM data words in which each CAM data word is associated with at least one category, and at least one associated match line which indicates when the data word matches a search data word;
    a plurality of priority encoders, in which each priority encoder is assigned to a respective category and is coupled to match lines associated with each of the CAM data words; and
    an allocation control circuit arranged and configured to selectively enable by category one or more of the priority encoders receiving match indications from a match line, based on pre-programmed allocation policies.

2. The CAM of claim 1, further comprising averaging circuits associated with each CAM word category for determining a usage average in each category.

3. The CAM of claim 2, wherein the averaging circuits include an up/down counter for holding a dynamic usage average.

4. The CAM of claim 3, wherein the averaging circuits include at least one shift register coupled to the up/down counter for holding a number of match indications for which the usage average is determined.

5. The CAM of claim 4, wherein the averaging circuits include a plurality of shift registers, and the dynamic usage average is determined based on the number of match indications held in more than one shift register.

6. The CAM of claim 1, wherein the allocation control circuit makes priority encoder enabling decisions based on a pre-programmed allocation policy.

7. The CAM of claim 6, wherein the preprogrammed allocation policy is based on an amount of network bandwidth to be allocated for each category.

8. The CAM of claim 6, wherein the allocation control circuit receives input signals indicating CAM word match usage in a plurality of categories for deciding whether to enable encoding by a respective priority encoder.

9. The CAM of claim 6, further comprising a user override for forcing encoding by a priority encoder regardless of the preprogrammed allocation policy.

10. The CAM of claim 9, wherein the user override is implemented by way of a user assigned category.

11. A content addressable memory (CAM) comprising:
    a plurality of priority encoders in which each priority encoder is assigned one of at least two categories and is arranged and configured to encode CAM words in the same respective category and which match a search criteria, and
    an allocation control circuit for selectively enabling the priority encoders assigned a particular category based on an allocation protocol.

12. The CAM of claim 11, further comprising a comparand register, and a priority code section associated with each CAM word to define which priority encoder is to be used in the event of a match between the data stored in a CAM word and the data in the comparand register.

13. The CAM of claim 11, further comprising a comparand register, and a user-selectable priority code provided in the comparand register for overriding which priority encoder is to be used as determined by the allocation control circuit in the event of a match between the data stored in a CAM word and the data in the comparand register.

14. The CAM of claim 11, wherein the allocation control circuit is a processor that receives indications from all said plurality of priority encoders of matches in that priority encoder's category, calculates data traffic parameters including bandwidth usage in each category, and based on preprogrammed policies, determines which of the priority encoders to enable.

15. The CAM of claim 14, further comprising a counter associated with the allocation control circuit for calculating bandwidth usage for each of said plurality of priority encoders.

16. The CAM of claim 15, further comprising a magnitude comparator connected to the counter for determining if the number of CAM word matches in a category is below or above the bandwidth allocated for that category.

17. The CAM of claim 11, further comprising an averager for dynamically determining a usage average for each category.

18. The CAM of claim 17, wherein the averager includes an up/down counter holding a dynamic average of usage.

19. The CAM of claim 17, wherein the averager includes a shift register for determining an average over a fixed number of inputs.

20. The CAM of claim 19, further comprising a magnitude comparator for comparing an average usage to an allocated usage.

21. The CAM of claim 17, wherein the averager includes a series of shift registers and a multiplexer for determining an average over a variable number of inputs.

22. The CAM of claim 17, further comprising a decision circuit arranged and configured to process the usage average for each category.

23. A content addressable memory comprising:
    a plurality of priority encoders, in which each priority encoder is assigned to a category of stored words; and
    a processor arranged and configured to receive an indication of data word matches based on a memory search and allocate priority encoding bandwidth by category among said plurality of priority encoders based on pre-programmed policies.

24. A content addressable memory comprising:
    a plurality of priority encoders for encoding match lines associated with CAM words categorized by type, each priority encoder having an associated category; and
    an allocation control circuit for selectively enabling each of the priority encoders associated with a particular category based on a priority encoder allocation protocol.

25. A method of operating a content addressable memory, the method comprising:
    storing words having specified category codes in the content addressable memory;
    searching for matching words among the stored words; and
    priority encoding the matching words using a plurality of priority encoders, matching words being encoded by a priority encoder assigned to the same category code specified for each respective matching word.

26. The method of claim 25, further comprising controlling operation of the priority encoder.

27. The method of claim 26, wherein operation of the priority encoder is controlled on the basis of a preprogrammed allocation policy.

28. The method of claim 27, wherein the allocation policy is determined on the basis of an amount of network bandwidth to be allocated to each specified category code.

29. The method of claim 26, further comprising the step of calculating an average amount of word matching and allowing in each category code.

30. The method of claim 29, wherein operation of the priority encoder is controlled based on the average amount of word matching and allowing.

31. A method of operating a content addressable memory, the method comprising:
  encoding data word matches using a plurality of priority encoders, each priority coder being assigned to a selected category; and
  indicating those priority encoders which receive matches to an allocation control which:
    calculates data traffic parameters; and
    enables priority encoders by category based on the calculated data traffic parameters and a preprogrammed allocation policy.

32. The method of claim 31, wherein the allocation policy is based on an amount of bandwidth to be provided to each category.

33. The method of claim 31, wherein the allocation is automatic.

34. The method of claim 31, wherein the allocation is dynamic.

35. The method of claim 34, comprising the step of determining a dynamic average of priority usage by averaging CAM word matches in a category, and comparing the average to an allocated percentage.

36. A method of operating a CAM, the method comprising the steps of:
  determining if a first packet is pending in a CAM word first priority;
  determining if a second packet is allowed in a second priority;
  comparing the packet's usage to an allocated priority usage percentage; and,
  selectively enabling the first or second packet based on the respective priority and the allocated priority usage percentage.

37. The method of claim 36, further comprising the step of determining if a packet is allowed in a third priority.

38. A router comprising:
  a plurality of message receiving inputs;
  a plurality of message transmitting outputs; and
  a content addressable memory (CAM) used to route messages on the inputs to the outputs, the CAM including:
    a plurality of priority encoders for encoding match lines associated with categorized CAM words, each of the priority encoders being associated with a particular category; and
    an allocation control circuit for selectively enabling by category match line encoding by each of the priority encoders based on an allocation protocol.

39. The router of claim 38, further comprising address encoding circuitry for outputting the address locations of each match line encoded by a priority encoder.

40. The router of claim 38, wherein the priority encoder includes a plurality of match indicator stages, each indicator stage being associated with a match line input.

41. A method of operating a router, the method comprising steps of:
  receiving a plurality of message inputs;
  transmitting a plurality of message outputs; and
  routing messages on the inputs to the outputs using a content addressable memory (CAM), the CAM performing the method of:
    storing words having specified category codes in the content addressable memory;
    searching for matching words among the stored words; and
    priority encoding the matching words, each matching word being encoded using a priority encoder assigned to the same category as specified for a respective matching word.

* * * * *

UNITED STATES PATENT AND TRADEMARK OFFICE
CERTIFICATE OF CORRECTION

PATENT NO. : 6,934,798 B2
DATED : August 23, 2005
INVENTOR(S) : Alon Regev et al.

It is certified that error appears in the above-identified patent and that said Letters Patent is hereby corrected as shown below:

Column 5,
Line 14, "every a "1"appears" should read -- every time a "1" appears --; and
Line 36, "a indication" should read -- an indication --.

Signed and Sealed this

Twenty-ninth Day of November, 2005

JON W. DUDAS
*Director of the United States Patent and Trademark Office*